(12) United States Patent
Wang et al.

(10) Patent No.: US 10,083,930 B2
(45) Date of Patent: Sep. 25, 2018

(54) SEMICONDUCTOR DEVICE REDUCING PARASITIC LOOP INDUCTANCE OF SYSTEM

(71) Applicant: Monolithic Power Systems, Inc., San Jose, CA (US)

(72) Inventors: Huaifeng Wang, Chengdu (CN); Eric Braun, Mountain View, CA (US); Hunt Hang Jiang, Saratoga, CA (US); Francis Yu, Sunnyvale, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 5 days.

(21) Appl. No.: 15/411,899

(22) Filed: Jan. 20, 2017

(65) Prior Publication Data

US 2017/0214319 A1    Jul. 27, 2017

(30) Foreign Application Priority Data

Jan. 22, 2016 (CN) .......................... 2016 1 0041777

(51) Int. Cl.
*H02M 3/158* (2006.01)
*H01L 23/00* (2006.01)
*H01L 23/495* (2006.01)

(52) U.S. Cl.
CPC ........ *H01L 24/40* (2013.01); *H01L 23/49575* (2013.01); *H02M 3/1588* (2013.01); *H01L 2924/00014* (2013.01); *H01L 2924/14252* (2013.01)

(58) Field of Classification Search
CPC ............. H01L 24/40; H01L 23/49575; H01L 2924/00014; H01L 2924/14252; H02M 3/1588

USPC .......................................... 323/271; 363/147
See application file for complete search history.

(56) References Cited

U.S. PATENT DOCUMENTS

| | | | | |
|---|---|---|---|---|
| 7,989,953 B1* | 8/2011 | Jergovic | .............. | H01L 23/4824 257/737 |
| 9,806,029 B2* | 10/2017 | Otremba | ............. | H01L 23/5384 |
| 2004/0169266 A1* | 9/2004 | Maxwell | ............. | H01L 23/5385 257/684 |
| 2004/0227547 A1* | 11/2004 | Shiraishi | ............... | H01L 23/495 327/110 |
| 2005/0024838 A1* | 2/2005 | Maxwell | ............. | H01L 23/5385 361/782 |
| 2007/0267742 A1* | 11/2007 | Tai | .................... | H01L 23/49562 257/728 |

(Continued)

OTHER PUBLICATIONS

Received STIC search report from EIC 2800 searcher Samir Patel dated Aug. 3, 2017.*

*Primary Examiner* — Timothy J Dole
*Assistant Examiner* — Htet Z Kyaw
(74) *Attorney, Agent, or Firm* — Perkins Coie LLP

(57) ABSTRACT

A semiconductor device reducing parasitic loop inductance of system for the switching converter. The semiconductor device has an input voltage pin, a ground reference pin, a switching pin, and a semiconductor die, wherein the semiconductor die comprises a high-side power switch and a low-side power switch and a metal connection. The metal connection directly connects the high-side power switch and the first terminal of the low-side power switch, and is along and proximity to an edge of the semiconductor device to which the input voltage pin is distributed.

13 Claims, 4 Drawing Sheets

(56) References Cited

U.S. PATENT DOCUMENTS

| | | | |
|---|---|---|---|
| 2009/0309235 A1* | 12/2009 | Suthiwongsunthorn | H01L 23/3114 257/777 |
| 2010/0072606 A1* | 3/2010 | Yang | H01L 23/481 257/692 |
| 2010/0171543 A1* | 7/2010 | Korec | H01L 23/49524 327/436 |
| 2011/0031947 A1* | 2/2011 | You | H01L 23/49548 323/282 |
| 2011/0148506 A1* | 6/2011 | Korec | H01L 27/0629 327/434 |
| 2012/0273929 A1* | 11/2012 | Jiang | H01L 23/49572 257/673 |
| 2012/0299150 A1* | 11/2012 | Tang | H01L 23/36 257/531 |
| 2014/0003179 A1* | 1/2014 | Girdhar | H01L 21/50 365/226 |
| 2015/0206830 A1* | 7/2015 | Takada | H01L 23/49562 257/676 |
| 2015/0271913 A1* | 9/2015 | Stepniak | H05K 1/0231 361/270 |
| 2016/0064291 A1* | 3/2016 | Ishii | G01R 1/06738 438/15 |

* cited by examiner

SEMICONDUCTOR DEVICE REDUCING PARASITIC LOOP INDUCTANCE OF SYSTEM

CROSS-REFERENCE TO RELATED APPLICATION

This application claims priority to and the benefit of CN Patent Application No. 201610041777.1, filed Jan. 22, 2016, which is incorporated herein by reference in its entirety.

TECHNICAL FIELD

The present invention generally relates to semiconductor devices, and more particularly but not exclusively relates to reducing parasitic loop inductance of the semiconductor devices.

BACKGROUND

FIG. 1 schematically shows a prior art switching converter 10. As illustrated in FIG. 1, the switching converter 10 comprises: an input capacitor Cin coupled between an input voltage Vin and a ground reference GND; a high-side power switch PM1 and a low-side power switch PM2 serially coupled between the input voltage Vin and the ground reference GND; an inductor L1 coupled between a switching node SW and the ground reference GND; an output capacitor Cout coupled between an output voltage Vout and the ground reference GND; and a controller 101 configured to control the high-side power switch PM1 and the low-side power switch PM2.

In the switching converter 10, the high-side power switch PM1 and the low-side power switch PM2 are alternately turned on and off. As a result, a square signal Vsw with certain duty ratio is generated at the switching node SW. The inductor L1 and the capacitor Cout are configured to filter the square signal Vsw so as to generate the output voltage Vout.

In FIG. 1, a path going through the input capacitor Cin, the high-side power switch PM1 and the low-side power switch PM2 forms a RLC resonance loop, wherein a parasitic inductance of the RLC resonance loop is represented by an inductor Lp shown in FIG. 1. The alternating on and off of the high-side power switch PM1 and the low-side power switch PM2 cause resonance along the RLC resonance loop, which further incurs a series of problems such as high frequency EMI (Electro Magnetic Interference), and voltage overshoot at the switching node SW.

SUMMARY OF THE INVENTION

The present invention adopts a metal connection on a RDL (Re-Distribution Layer) of a semiconductor die to connect a high-side power switch and a low-side power switch, wherein the metal connection is along and proximity to an edge of the semiconductor device which an input voltage pin is distributed to, or which is proximity to an input capacitor, so as to reduce a parasitic inductance in a RLC resonance loop comprising an input capacitor, the high-side power switch and the low-side power switch. The technology disclosed by the present invention effectively reduces high frequency EMI, voltage overshoot at a switching node of a switching converter.

There has been provided, in accordance with an embodiment of the present invention, a semiconductor device used with a switching converter, comprising: an input voltage pin configured to receive an input voltage of the switching converter; a ground reference pin coupled to a ground reference of the switching converter; a switching pin; a high-side power switch having a first terminal coupled to the input voltage pin and a second terminal coupled to the switching pin via lead frames; a low-side power switch having a first terminal coupled to the switching pin and a second terminal coupled to the ground reference pin via lead frames; and a metal connection configured to connect the second terminal of the high-side power switch and the first terminal of the low-side power switch, wherein the metal connection is located on a semiconductor die integrating the high-side power switch and the low-side power switch, and is along and proximity to an edge of the semiconductor device to which the input voltage pin is distributed.

There has been provided, in accordance with an embodiment of the present invention, a hardware circuit, comprising: a semiconductor device used with a switching converter, wherein the semiconductor device comprises: an input voltage pin configured to receive an input voltage of the switching converter; a ground reference pin coupled to an ground reference of the switching converter; a switching pin; a high-side power switch having a first terminal coupled to the input voltage pin and a second terminal coupled to the switching pin via lead frames; a low-side power switch having a first terminal coupled to the switching pin and a second terminal coupled to the ground reference pin via lead frames; and a metal connection configured to connect the second terminal of the high-side power switch and the first terminal of the low-side power switch, wherein the metal connection is located on a semiconductor die integrating the high-side power switch and the low-side power switch, and is along and proximity to an edge of the semiconductor device to which the input voltage pin is distributed; and a PCB (Printed Circuit Board) having an input voltage metal layer, a ground reference metal layer, and a switching node metal layer.

There has been provided, in accordance with an embodiment of the present invention, a hardware circuit, comprising: a semiconductor device used with a switching converter, wherein the semiconductor device comprises: an input voltage pin configured to receive an input voltage of the switching converter; a ground reference pin coupled to a ground reference of the switching converter; a switching pin; a high-side power switch having a first terminal coupled to the input voltage pin and a second terminal coupled to the switching pin via lead frames; a low-side power switch having a first terminal coupled to the switching pin and a second terminal coupled to the ground reference pin via lead frames; and a metal connection configured to connect the second terminal of the high-side power switch and the first terminal of the low-side power switch, wherein the metal connection is located on a semiconductor die integrating the high-side power switch and the low-side power switch, and is along and proximity to an edge of the semiconductor device; a PCB (Printed Circuit Board) having an input voltage metal layer, a ground reference metal layer, and a switching node metal layer; and an input capacitor having a first terminal coupled with the input voltage pin of the semiconductor device via the input voltage metal layer and a second terminal coupled to the ground reference pin of the semiconductor device via the ground reference metal layer; wherein, the edge of the semiconductor device, which the metal connection is along and proximity to, is proximity to the input capacitor.

BRIEF DESCRIPTION OF THE DRAWINGS

For a purpose of better understanding of the present invention, a detailed description will be given in accordance with the drawings below.

DETAILED DESCRIPTION

Figure 1:
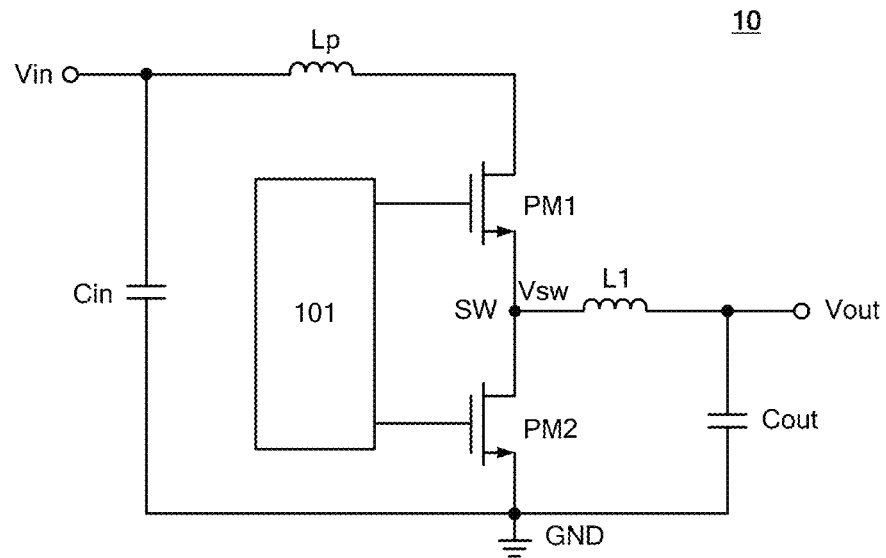
FIG. 1 schematically shows a prior art switching converter 10.

Description in detail will be given to the specific embodiments of the present invention, and it should be noted that the embodiments here are exemplary, not to confine the scope of the invention. In the present disclosure, numerous specific details are provided for a thorough understanding of the embodiments for the invention. Persons of ordinary skill in the art will recognize, however, that the invention can be practiced without one or more of the specific details and embodied in various forms, not to be deemed limited to the embodiment set forth here. In other instances, well-known methods, procedures, components, and circuits have not been described in detail so as not to unnecessarily obscure aspects of the present invention. Besides, the zones showed in the drawings are substantially schematic, whose shapes are not intended to limit the scope of the invention. It should be understood, moreover, that the drawings are not in scale, sizes of the layers and zones can be magnified for clarity.

In the entire specifications, the phrases "an embodiment", "the embodiment", "an example", "the example" are meaning that the specific features, structures and characteristics described in conjunction with this embodiment or example are included in at least one embodiment of the present invention. Consequently, the phrases "an embodiment", "the embodiment", "an example", "the example" in any paragraphs and lines of the entire specifications, are not necessarily indicated to the same embodiments or examples. Furthermore, the specific features, structures and characteristics can be integrated into one or more embodiments or examples through any suitable combination and/or subcombination. The term "and/or" comprise any or the all combinations in one or more concerning listed items.

The phrase "connect" or "couple" refers to direct connection or indirect connection via interim media. On the contrary, the phrase "direct connect" or "direct coupling" refers to direct connection without interim media.

The same reference label in different drawings indicates the same or like components.

Figure 2:
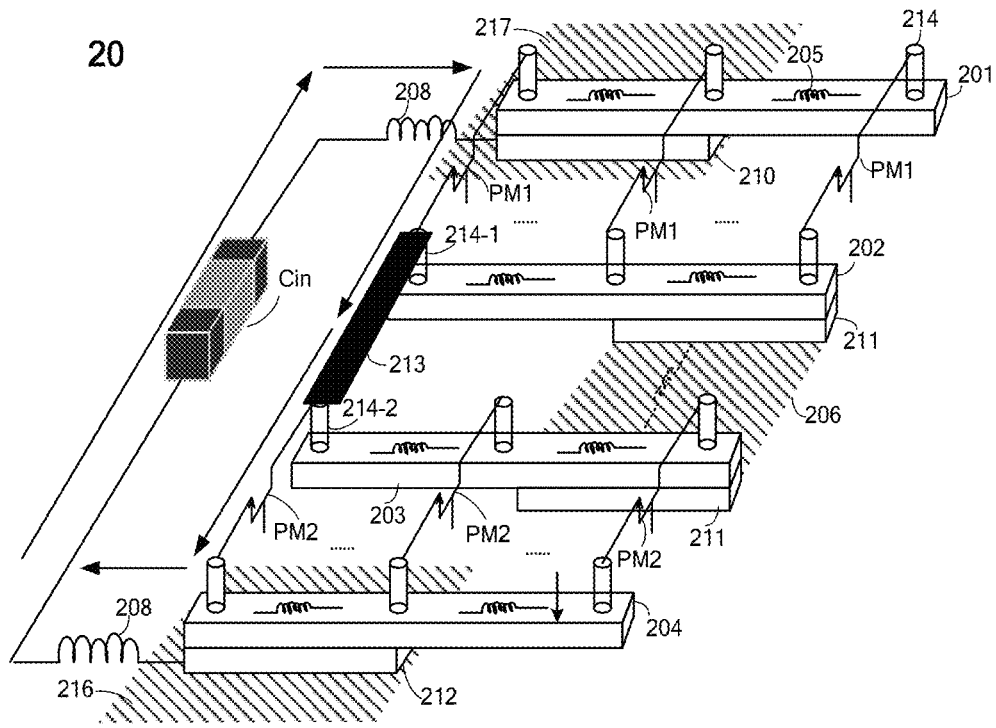
FIG. 2 schematically shows structure of a semiconductor device 20 in accordance with an embodiment of the present invention.

FIG. 2 schematically shows structure of a semiconductor device 20 in accordance with an embodiment of the present invention. The semiconductor device 20 may be used with the switching converter 10 shown in FIG. 1. The semiconductor device 20 comprises: an input voltage pin 210 configured to receive the input voltage Vin of the switching converter 10; a ground reference pin 212 coupled to the ground reference GND of the switching converter 10; a switching pin 211; a high-side power switch PM1, having a first terminal coupled to the input voltage pin 210 via a lead frame 201 and a second terminal coupled to the switching pin 211 via a lead frame 202; a low-side power switch PM2, having a first terminal coupled to the switching pin 211 via a lead frame 203 and a second terminal coupled to the ground reference pin 212 via a lead frame 204; a metal connection 213 configured to connect the second terminal of the high-side power switch PM1 and the first terminal of the low-side power switch PM2, wherein the metal connection 213 is located on a semiconductor die integrating the high-side power switch PM1 and the low-side switch PM2, and is along and proximity to an edge of the semiconductor device 20 to which the input voltage pin 210 is distributed. In the example of FIG. 2, the edge of the semiconductor device 20 which the metal connection is proximity to and the input voltage pin 210 is distributed to, is also where the ground reference pin 212 is distributed, and is proximity to the input capacitor Cin for shortening the resonance loop and reducing the parasitic inductance, as persons of ordinary skills in art should recognize.

In the example of FIG. 2, the input capacitor Cin is a discrete component, and is attached to a same PCB with the semiconductor device. The power switches PM1 and PM2 are integrated together on a same semiconductor die which is packaged to be the semiconductor device 20 with a number of pins. The semiconductor device 20 and the discrete components, e.g. the input capacitor Cin, are coupled to each other by being soldered on a PCB (Printed Circuit Board), as shown in the example of FIG. 2. Persons of ordinary skill in the art should know that the controller 101 in the example of FIG. 1 may be integrated with the power switches PM1 and PM2, or may be packaged individually. Since the controller 101 is not in the RLC resonance loop discussed by the present invention, only the power switches PM1 and PM2 are shown in the example of FIG. 2.

In the example of FIG. 2, inductors 205 represent the parasitic inductance in each lead frame; inductors 208 represent the parasitic inductance of the path going through the input capacitor Cin and the power switches PM1 and PM2; pillars 214 represents bumping connections between the semiconductor die and the lead frames. For the purpose of clarity, only the pillar in the upper right corner is labeled. Persons of ordinary skill in the art should know that a power switch comprises a plurality of paralleled switches in reality. For the purpose of clarity, the real layout of the power switches PM1 and PM2 is not shown in the example of FIG. 2. Instead, the power switches PM1 and PM2 are represented as a plurality of electrical symbols for switches. In the example of FIG. 2, the power switches PM1 and PM2 are merely schematic for indicating the connection, not for denoting a real structure of the semiconductor device 20. The lead frame 201 connects, via the pillars 214, with the first terminal of the high-side power switch PM1; the lead frame 202 connects, via the pillars 214, with the second terminal of the high-side power switch PM1; the lead frame 203 connects, via the pillars 214, with the first terminal of the low-side power switch PM2; the lead frame 204 connects, via the pillars 214, with the second terminal of the low-side power switch PM2.

In the example of FIG. 2, a shaded area 217 represents a metal layer connected to the input voltage Vin on the PCB; a shaded area 216 represents a metal layer connected to the ground reference GND on the PCB; and a shaded area 206 represents a metal layer connected to the switching node SW on the PCB. To optimize the PCB layout, the pin distribution of the semiconductor device 20 is confined, i.e. the switching pin 211, the input voltage pin 217 and the ground reference pin 212 are distributed to different edges of the semiconductor device 20 so that metal layers can be spread out on the PCB, as shown in the example of FIG. 2. To reduce parasitic effect, the input capacitor Cin on the PCB is proximity to the input voltage pin 210 and the ground reference pin 212. In prior art, the resonance loop from the high-side power switch PM1 to the low-side power switch PM2 is a current path along the pillar 214-1, the lead frame 202, the switching pin 211 under the lead frame 202, the metal layer 206 on the PCB, the switching node 211 under the lead frame 203, the lead frame 203 and the pillar 214-2, which is obviously too long. Although the resonance loop can be shortened by connecting the second terminal of the high-side power switch PM1 and the first terminal of the low-side power switch to the same lead frame 202 via the pillars 214-1 and 214-2 respectively, the current path still has to go through the pillars 214-1 and 214-2, and the lead frame 202.

The metal connection 213 disclosed by the present invention directly connects the second terminal of the high-side power switch PM1 to the first terminal of the low-side power switch PM2, and is along and proximity to an edge of the semiconductor device 20 to which the input voltage pin 210 is distributed. In the example of FIG. 2, the ground reference pin 212 is distributed to the same edge of the semiconductor device 20 with the input voltage pin 210; persons of ordinary skill in the art should know that the input capacitor Cin is also proximity to the above same edge of the semiconductor device 20 for shortening the resonance loop and reducing the parasitic inductance. Thus, the resonance loop from the high-side power switch PM1 to the low-side power switch PM2 is greatly shortened by bypassing the pillars 214 on the lead frames 202 and 203, the lead frames 202 and 203, the switching pin 211 and the metal layer 206. Persons of ordinary skill in the art should know that there may be several metal layers on the semiconductor die. The metal connection 213 may be located on any metal layer.

In the example of FIG. 2, the lead frames 201, 202, 203 and 204 are merely schematically illustrated. In practical use, the lead frames 201, 202, 203 and 204 may respectively comprise multiple paralleled lead frames. The pillars 214 and the power switches PM1 and PM2 are as well schematically illustrated, the numbers of which may be set up respectively based on requirements in practical use.

In the example of FIG. 2, the input voltage pin 210 and the ground reference pin 212 are distributed to the same edge of the lead frame structure (i.e. the semiconductor device 20), with the switching pin 211 distributed to another edge. Persons of ordinary skill in the art should know that the input voltage pin 210, the ground reference pin 212 and the switching pin 211 may be distributed to different edges in other applications. The input voltage pin 210, the reference-ground-pin 212 and the switching pin 211 may be distributed to three different edges of the semiconductor device 20, or may be distributed to a same edge of the semiconductor device 20. As long as the metal connection 213, however, is along and proximity to the same edge of the semiconductor device 20 which is proximity to the input capacitor Cin, it will be construed as in merits of the substantial scope of the invention.

Figure 3:
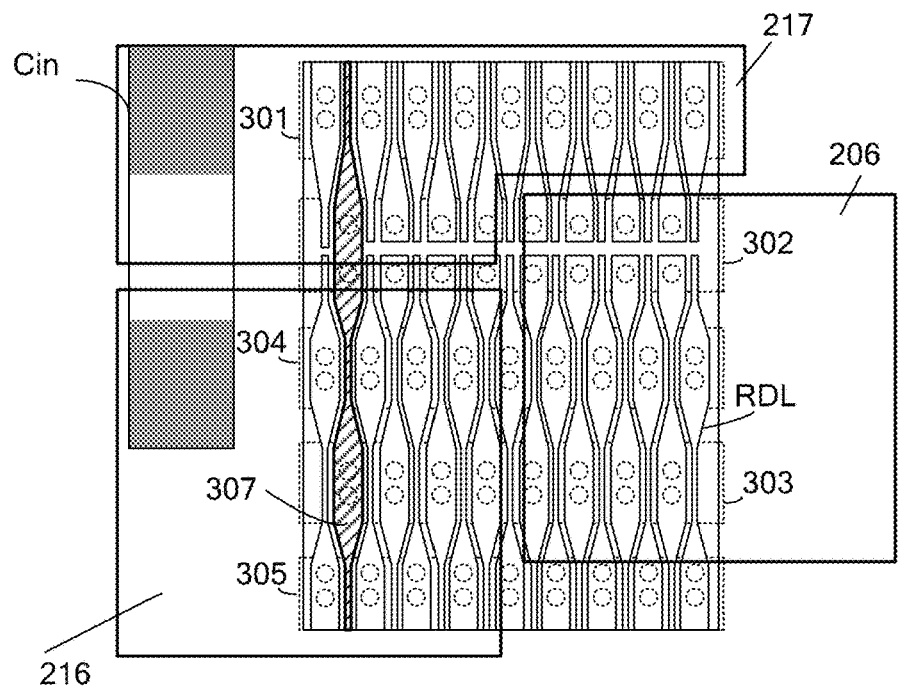
FIG. 3 schematically shows a layout of the power switches PM1 and PM2 in accordance with an embodiment of the present invention.

FIG. 3 schematically shows a layout of the power switches PM1 and PM2 in accordance with an embodiment of the present invention, in which the patterns presented in diamond shape is the RDL (Re-Distribution Layer). Different parts of the RDL connect respectively with different lead frames via different pillars 214, which are represented as dotted circles since FIG. 3 is a top view of the layout. In the example of FIG. 3, a lead frame 301 connects with the input voltage pin 210; lead frames 302 and 303 connect with the switching pin 211; and lead frames 304 and 305 connect with the ground reference pin 212. The pins connected with the lead frames have not been shown in FIG. 3 for clarity. Persons of ordinary skill in the art may refer to FIG. 2 to learn the position of each pin. The metal layers 217, 216 and 206 are respectively the metal layers connected with the input voltage Vin, the ground reference GND and the switching node SW on the PCB. In an embodiment, the input capacitor Cin is attached to the PCB and is coupled between the metal layers 217 and 216. In FIG. 3, the pattern filled with the diagonal hatch lines is a metal connection 307. The second terminal of the high-side power switch PM1 (i.e. the terminal connected with the switching node SW) and the first terminal of the low-side power switch PM2 (i.e. the terminal connected with the switching node SW) are connected to the lead frame 302 via the pillars 214. The metal connection 307 directly connects the high-side power switch PM1 with the low-side power switch PM2 on the RDL, greatly shortening the resonance loop going through the input Cin, the high-side power switch PM1 and the low-side switch PM2. In the example of FIG. 3, the metal connection 307 is along and proximity to an edge of the semiconductor device 20, wherein the edge of the semiconductor device 20 is where the input voltage pin 210 is distributed. Likewise, the same edge of the semiconductor device 20 is also where the ground reference pin 212 is distributed, and is proximity to the input capacitor Cin.

Figure 4:
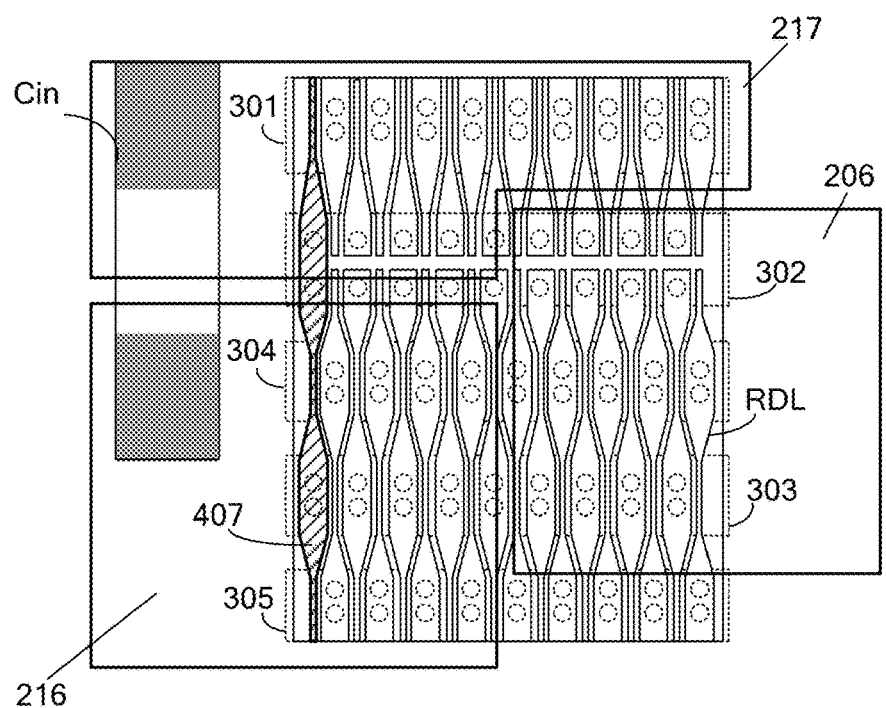
FIG. 4 schematically shows a layout of the power switches PM1 and PM2 in accordance with an embodiment of the present invention.

FIG. 4 schematically shows a layout of the power switches PM1 and PM2 in accordance with an embodiment of the present invention. Compared with FIG. 3, the distribution of the RDL is different, leading to differentiation in the position of a metal connection 407 on the RDL. Similar to FIG. 3, the metal connection 407 is along and proximity to an edge of the semiconductor device 20, wherein the edge of the semiconductor device 20 is where the input voltage pin 210 is distributed. The same edge of the semiconductor device 20 is also where the ground reference pin is distributed, and is proximity to the input capacitor Cin.

Figure 5:
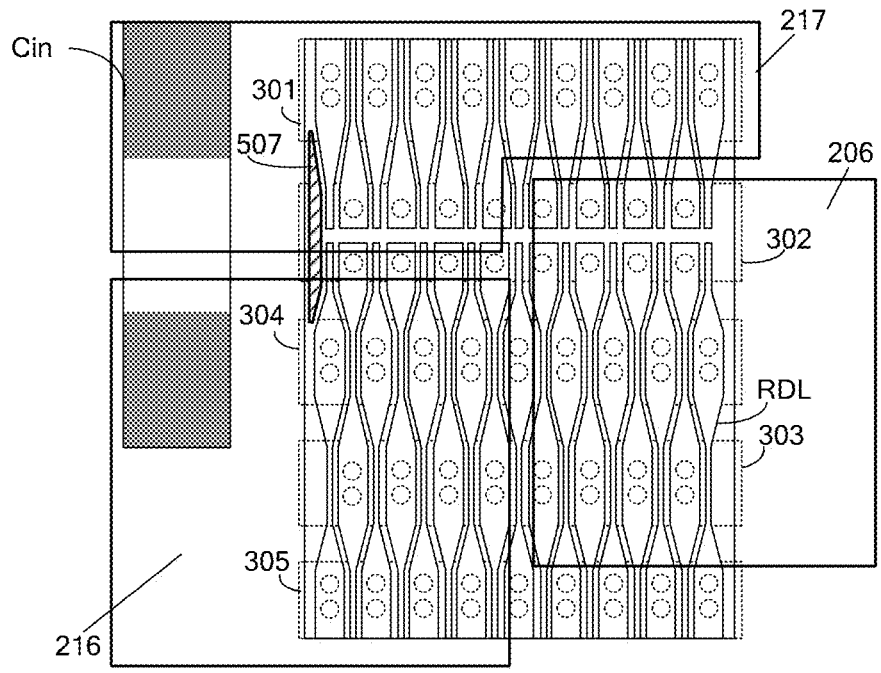
FIG. 5 schematically shows a layout of the power switches PM1 and PM2 in accordance with an embodiment of the present invention.

FIG. 5 schematically shows a layout of the power switches PM1 and PM2 in accordance with an embodiment of the present invention. Compared with FIG. 3, the distribution of the RDL is different, leading to differentiation in the position of a metal connection 507 on the RDL. Similar to FIG. 3, the metal connection 507 is along and proximity to an edge of the semiconductor device 20, wherein the edge of the semiconductor device 20 is where the input voltage pin 210 is distributed. The same edge of the semiconductor device 20 is also where the ground reference pin is distributed, and is proximity to the input capacitor Cin.

Figure 6:
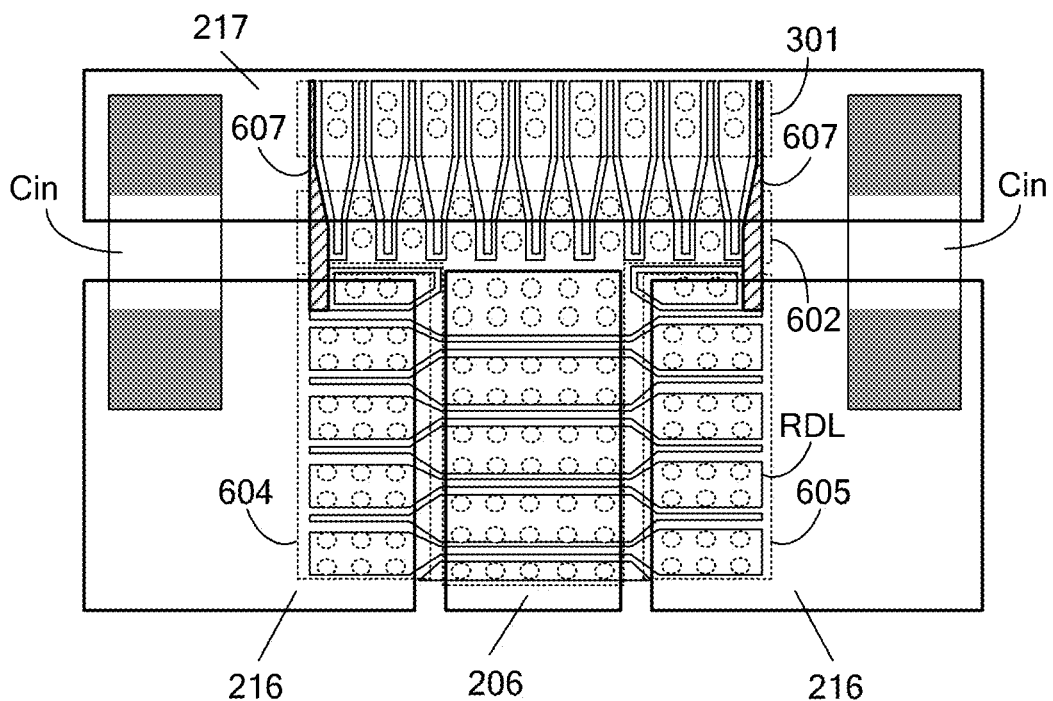
FIG. 6 schematically shows a layout of the power switches PM1 and PM2 in accordance with an embodiment of the present invention.

FIG. 6 schematically shows a layout of the power switches PM1 and PM2 in accordance with an embodiment of the present invention. In FIG. 6, the lead frame 301 connects with the input voltage pin 210; a lead frame 602, which is located in the center of the semiconductor die and is presented in T shape, connects with the switching pin 211;

lead frames 604 and 605 connect with the ground reference pin 212. The pins connected with the lead frames are under the corresponding lead frames as shown in FIG. 2 and have not been shown in FIG. 6 for clarity. The metal layers 217, 216, and 206 are the metal layers respectively connects with the input voltage Vin, the ground reference GND and the switching node SW. In the example of FIG. 6, the input capacitor Cin comprises two paralleled discrete capacitors attached to the PCB and distributed at two opposite edges of the semiconductor device 20. In other embodiments, the input capacitor Cin may comprise a plurality of paralleled discrete capacitors. In the example of FIG. 6, the metal layer on the semiconductor die which is connected to the T-shaped lead frame 602 via pillars 214 has already connected the high-side power switch PM1 with the low-side power switch PM2, yet the resonance loop between the input capacitor Cin, the high-side power switch PM1 and the low-side power switch PM2 is not the shortest due to the shape of the T-shaped lead frame 602. In FIG. 6, a metal connection 607 filled with diagonal hatch lines, being along and proximity to an edge of the semiconductor device 20 which is proximity to the input capacitors Cin, further shortens the resonance loop going through the input capacitor Cin, the high-side power switches PM1 and the low-side power switch PM2. In the example of FIG. 6, the edge of the semiconductor device 20 which the metal connection 607 is along and proximity to, is proximity to the input capacitor Cin.

In the example of FIG. 6, the input voltage pin 210, the ground reference pin 212 and the switching pin 211 are distributed to different edges of the semiconductor device 20. The input voltage pin 210 may be at the upside edge of the semiconductor device 20 and is under the lead frame 301. The ground reference pin 212 may be distributed at the right edge and left edge of the semiconductor device 20 and is under the lead frames 604 and 605. The switching pin 211 may be at the downside of the semiconductor device 20 and is under the lead frame 602. As long as the metal connection 607, however, is along and proximity to the same edge of the semiconductor device 20 which is proximity to the input capacitor Cin, it will be construed as in merits of the substantial scope of the invention.

Figure 7:
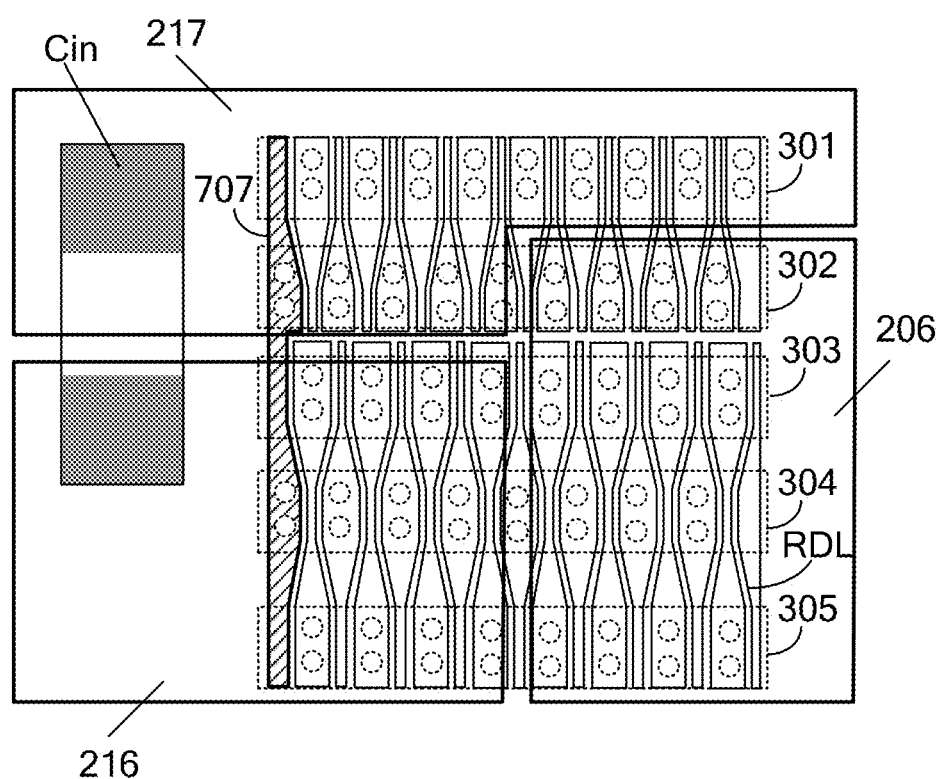
FIG. 7 schematically shows a layout of the power switches PM1 and PM2 in accordance with an embodiment of the present invention.

FIG. 7 schematically shows a layout of the power switches PM1 and PM2 in accordance with an embodiment of the present invention. Compared with the drawings from FIG. 3 to FIG. 5, the second terminal of the high-side power switch PM1 and the first terminal of the low-side power switch PM2 are respectively located on the different lead frames 302 and 304, and the distribution of the RDL is different, leading to differentiation in the shape and position of a metal connection 707 on the RDL. However, the metal connection 707 is still along and proximity to the same edge of the semiconductor device 20 which the input voltage pin 210 and the ground reference pin 212 are distributed to, i.e. the same edge of the semiconductor device 20 which is proximity to the input capacitor Cin.

The RDL is presented in diamond shape in the drawings from FIG. 3 to FIG. 7. In other embodiments, the RDL may be in other shapes and forms, and the metal layers connecting the terminals of the power switches PM1 and PM2 on the die could also be in other shapes and forms.

Besides, in the aforementioned embodiments, the metal connection is a part of the RDL. In other embodiments, however, the metal connection may be located on any other metal layer, as a part of any other metal layer. The layout of any other metal layer, which is not illustrated here, may be similar to the RDL shown in FIGS. 3-7, or may be in any suitable shapes and forms.

While specific embodiments of the present invention have been provided, it is to be understood that these embodiments are for illustration purposes and not limiting. Since the invention can be practiced in various forms without distracting the spirit or the substance of the invention, it should be understood that the above embodiments are not confined to any aforementioned specific detail, but should be explanatory broadly within the spirit and scope limited by the appended claims. Thus, all the variations and modification falling into the scope of the claims and their equivalents should be covered by the appended claims.

What is claimed is:

1. A semiconductor device used with a switching converter, comprising:
    an input voltage pin configured to receive an input voltage of the switching converter;
    a ground reference pin coupled to a ground reference of the switching converter;
    a switching pin;
    a high-side power switch having a first terminal coupled to the input voltage pin and a second terminal coupled to the switching pin via lead frames;
    a low-side power switch having a first terminal coupled to the switching pin and a second terminal coupled to the ground reference pin via lead frames; and
    a metal connection configured to connect the second terminal of the high-side power switch and the first terminal of the low-side power switch, wherein the metal connection is located on a semiconductor die integrating the high-side power switch and the low-side power switch, and is along and proximity to an edge of the semiconductor device to which the input voltage pin is distributed.

2. The semiconductor device of claim 1, wherein the metal connection is located on a RDL (Re-Distribution Layer) of the semiconductor die.

3. The semiconductor device of claim 1, wherein the metal connection is located on any metal layer of the semiconductor die.

4. The semiconductor device of claim 1, wherein the input voltage pin and the ground reference pin are distributed to the same edge of the semiconductor device.

5. The semiconductor device of claim 1, used with an input capacitor of the switching converter, wherein the input capacitor is proximity to the same edge of the semiconductor device with the metal connection, and is attached to a same PCB with the semiconductor device.

6. A hardware circuit, comprising:
    a semiconductor device used with a switching converter, wherein the semiconductor device comprises:
        an input voltage pin configured to receive an input voltage of the switching converter;
        a ground reference pin coupled to an ground reference of the switching converter;
        a switching pin;
        a high-side power switch having a first terminal coupled to the input voltage pin and a second terminal coupled to the switching pin via lead frames;
        a low-side power switch having a first terminal coupled to the switching pin and a second terminal coupled to the ground reference pin via lead frames; and
        a metal connection configured to connect the second terminal of the high-side power switch and the first terminal of the low-side power switch, wherein the metal connection is located on a semiconductor die integrating the high-side power switch and the low-side power switch, and is along and proximity to an edge of the semiconductor device to which the input voltage pin is distributed; and a PCB (Printed Circuit Board) having an input voltage metal layer, a ground reference metal layer, and a switching node metal layer.

7. The hardware circuit of claim 6, further comprising an input capacitor being proximity to the same edge of the semiconductor device with the metal connection, wherein the input capacitor has a first terminal coupled with the input voltage pin of the semiconductor device via the input voltage metal layer and a second terminal coupled to the ground reference pin of the semiconductor device via the ground reference metal layer, and is attached to the same PCB with the semiconductor device.

8. The hardware circuit of claim 6, wherein the metal connection is located on a RDL of the semiconductor die.

9. The hardware circuit of claim 6, wherein the metal connection is located on any metal layer of the semiconductor die.

10. The hardware circuit of claim 6, wherein the input voltage pin and the ground reference pin are distributed to the same edge of the semiconductor device.

11. A hardware circuit, comprising:
  a semiconductor device used with a switching converter, wherein the semiconductor device comprises:
    an input voltage pin configured to receive an input voltage of the switching converter;
    a ground reference pin coupled to an ground reference of the switching converter;
    a switching pin;
    a high-side power switch having a first terminal coupled to the input voltage pin and a second terminal coupled to the switching pin via lead frames;
    a low-side power switch having a first terminal coupled to the switching pin and a second terminal coupled to the ground reference pin via lead frames; and
    a metal connection configured to connect the second terminal of the high-side power switch and the first terminal of the low-side power switch, wherein the metal connection is located on a semiconductor die integrating the high-side power switch and the low-side power switch, and is along and proximity to an edge of the semiconductor device;
  a PCB (Printed Circuit Board) having an input voltage metal layer, a ground reference metal layer, and a switching node metal layer; and
  an input capacitor having a first terminal coupled with the input voltage pin of the semiconductor device via the input voltage metal layer and a second terminal coupled to the ground reference pin of the semiconductor device via the ground reference metal layer, wherein the input capacitor is attached to the same PCB with the semiconductor device;
  wherein, the edge of the semiconductor device, which the metal connection is along and proximity to, is proximity to the input capacitor.

12. The hardware circuit of claim 11, wherein the metal connection is located on a RDL of the semiconductor die.

13. The hardware circuit of claim 11, wherein the metal connection is located on any metal layer of the semiconductor die.

* * * * *